United States Patent
Mahatme et al.

(10) Patent No.: US 10,529,400 B1
(45) Date of Patent: Jan. 7, 2020

(54) MAGNETIC ATTACK DETECTION IN A MAGNETIC RANDOM ACCESS MEMORY (MRAM)

(71) Applicant: NXP USA, INC., Austin, TX (US)

(72) Inventors: Nihaar N. Mahatme, Austin, TX (US); Anirban Roy, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/047,077

(22) Filed: Jul. 27, 2018

(51) Int. Cl.
*G11C 11/00* (2006.01)
*G11C 11/16* (2006.01)
*G11C 29/50* (2006.01)
*H01L 43/02* (2006.01)

(52) U.S. Cl.
CPC ........ *G11C 11/1695* (2013.01); *G11C 11/161* (2013.01); *G11C 11/1673* (2013.01); *G11C 29/50* (2013.01); *H01L 43/02* (2013.01)

(58) Field of Classification Search
CPC .............. G11C 11/1695; G11C 11/161; G11C 11/1673; G11C 29/50; H01L 43/02
See application file for complete search history.

(56) References Cited

U.S. PATENT DOCUMENTS

| | | | |
|---|---|---|---|
| 6,999,339 B2 | 2/2006 | Tuttle et al. | |
| 8,351,289 B1* | 1/2013 | Brand ..................... | G11C 29/50 365/212 |
| 9,875,794 B2* | 1/2018 | Brand ..................... | G11C 29/50 |

FOREIGN PATENT DOCUMENTS

WO 2004032146 A2 4/2004

OTHER PUBLICATIONS

Nowak, Janusz J., et al.; Dependence of Voltage and Size on Write Error Rates in Spin-Transfer Torque Magnetic Random-Access Memory; IEEE Magnetics Letters, vol. 7; Mar. 8, 2016; DOI: 10.1109/LMAG.2016.2539256.

Wang, Chia-Yu, et al.; "Impact of External Magnetic Field on Embedded Perpendicular STT-MRAM Technology Qualified for Solder Reflow;" 2017 IEEE International Electron Devices Meeting (IEDM); Dec. 2-6, 2017; DOI: 10.1109/IEDM.2017.8268432.

MRAM Application Note: AN-316 Stray Magnetic Fields (SMFs): Introduction and Product Handling Guidelines, Honeywell; Sep. 2014.

Jang, Jae-Won, et al.; "Self-Correcting STTRAM under Magnetic Field Attacks;" 2015 52nd ACM/EDAC/IEEE Design Automation Conference (DAC); Conference Date: Jun. 8-12, 2015; DOI: 10.1145/2744769.2744909.

* cited by examiner

*Primary Examiner* — Gene N Auduong

(57) ABSTRACT

A Magnetic Random Access Memory (MRAM) array has a plurality of main MRAM bitcells and a plurality of canary MRAM bitcells in which a first Magnetic Tunnel Junction (MTJ) diameter of each of the main MRAM bitcells is larger than any second MTJ diameter of any of the canary bitcells. Test circuitry is configured to periodically poll the canary bitcells to determine if values stored at the canary bitcells match expected canary values. When the values do not match the expected canary values, the test circuitry is configured to indicate a presence of a magnetic field, and in response to determining the presence of the magnetic field, continue to poll the canary bitcells until the values match the expected canary values which indicates the magnetic field is no longer present.

20 Claims, 6 Drawing Sheets

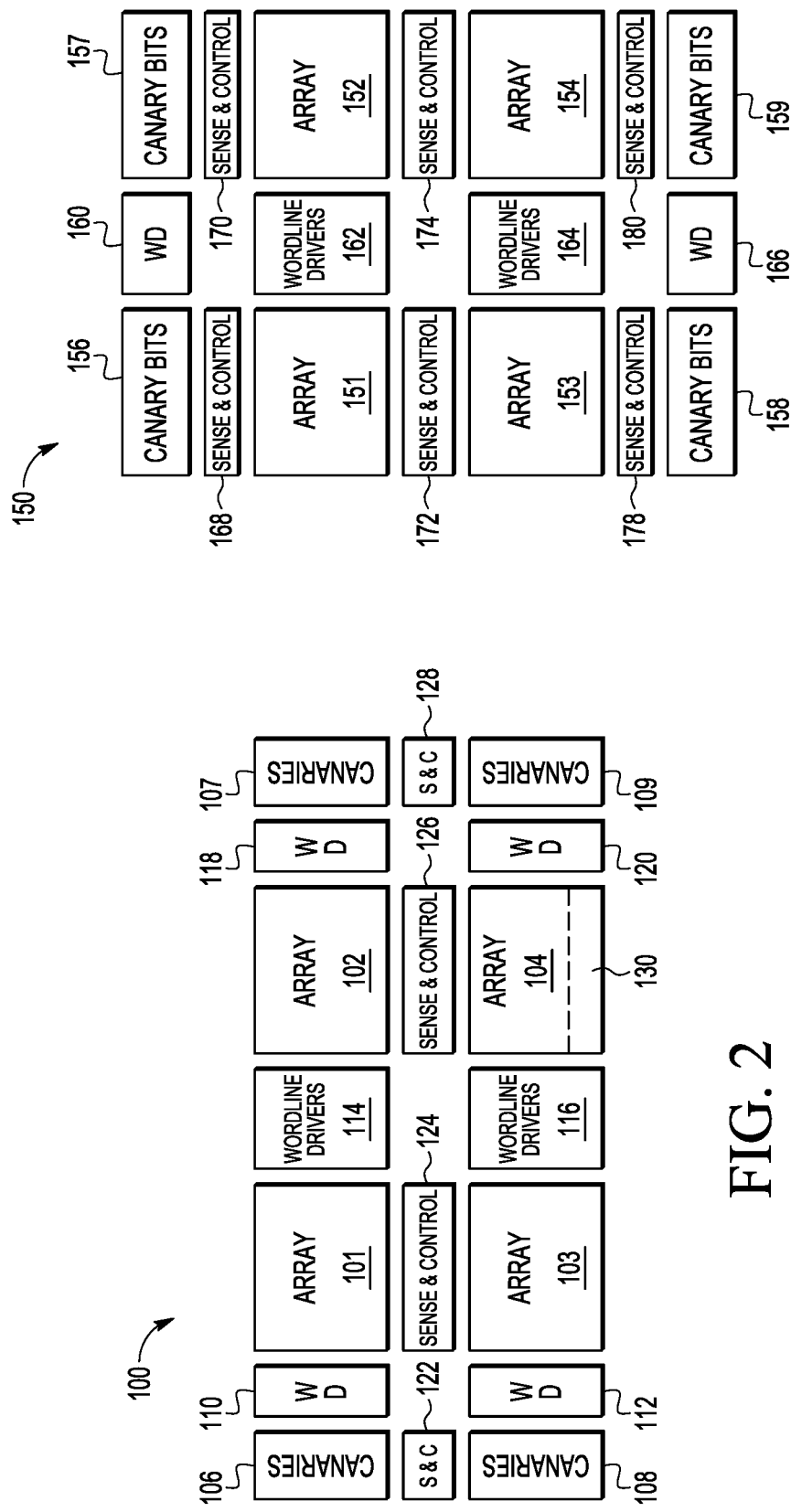

MAGNETIC ATTACK DETECTION IN A MAGNETIC RANDOM ACCESS MEMORY (MRAM)

BACKGROUND

Field

This disclosure relates generally to memories, and more specifically, to detecting magnetic attacks in a Magnetic Random Access Memory (MRAM).

Related Art

Magnetic Random Access Memories (MRAMs) are typically used to provide non-volatile storage in which the direction of spin of magnetic moments encodes stored data states. The magnetic element of an MRAM cell is the Magnetic Tunnel Junction (MTJ). For example, when the magnetic moments of the interacting magnetic layers of the MTJ are aligned, a low resistance state is stored, corresponding to a "0", and conversely, when the moments are misaligned, a high resistance is stored, corresponding to a "1". In order to switch the MTJ from one state to another, the energy barrier (Eb) between the two states must be exceeded. This can be accomplished by passing current through the MRAM cell in different directions. Magnetic fields near the MRAM cell are a risk to the integrity of the stored data since they can result in inadvertently switching the state of the MRAM cell. Therefore, a need exists for detecting external magnetic fields which can threaten the data integrity of an MRAM.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 2 illustrates, in block diagram form, an MRAM with canary bits, in accordance with one embodiment of the present invention.

FIG. 3 illustrates, in block diagram form, an MRAM with canary bits, in accordance with another embodiment of the present invention.

DETAILED DESCRIPTION

Dimensions of an MTJ typically determine the energy required to switch the state of the cell. For example, MTJs with smaller dimensions are weaker and requires less energy to switch states. Therefore, in one embodiment, in an MRAM array, intentionally weaker cells, referred to as canary cells, having a smaller MTJ diameter than regular MRAM cells of the main array are used to warn about an oncoming magnetic field that may corrupt the main array. The diameter of the MTJ in these canary cells is chosen such that these cells switch states first, prior to cells of the main array, upon being exposed to external magnetic fields such that upon detection of a canary cell switching states, a warning is provided. The main MRAM array is interspersed with these canary cells to provide spatial resolution in case of a highly localized magnetic field disturb.

Figure 1:
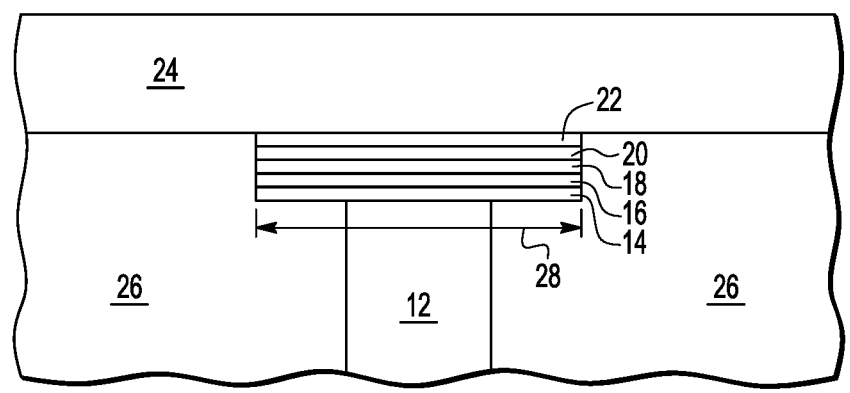
FIG. 1 illustrates, in cross-section form, an MRAM cell in accordance with one embodiment of the present invention.

FIG. 1 illustrates, in cross-section form, an MRAM cell 10 in accordance with one embodiment of the present invention. Cell 10 includes a conductive via 12. On top and in contact with via 12 is a conductive bottom electrode 14. On top of bottom electrode 14 is a pinned layer 16, and on top of pinned layer 16, is a dielectric layer 18. On top of dielectric layer 18, is a free layer 20 and one or more additional layers, such as layer 22, and on top of these additional layers is a metal interconnect layer 24. Via 12 and layers 14, 16, 18, 20, and 22 are surrounded by an interlayer dielectric layer (ILD) 26. In one embodiment, the one or more additional layers may include more or fewer layers than illustrated.

In operation, pinned layer 16 has a fixed magnetization direction. The magnetization direction of free layer 20 is free to change directions, depending on the applied magnetic field. The magnetization directions of layers 16 and 20 determine the resistance state of the cell 10. For example, when both are aligned in the same direction, cell 10 stores a low resistance state and when in different directions, cell 10 stores a high resistance state. The states can be switched by passing current through metal 24 in different directions. Illustrated in FIG. 1 is a diameter 28 of cell 10, referred to as the MTJ diameter. This MTJ diameter corresponds to the diameter of layers 14, 16, 18, 20, and 22, formed between via 12 and metal layer 24. For example, these layers may be formed having a circular layout, when viewed from the top down. As diameter 28 increases, exponentially higher current or magnetic fields are needed to switch states of cell 10. Therefore, in one embodiment, MRAM cells having a smaller MTJ diameter are used as canary cells while MRAM cells of the main array have larger MTJ diameters than the canary cells. In one embodiment, the dimensions, e.g. MTJ diameter, of canary cells are at least 30% smaller than those of non-canary cells of the main array, or, alternatively, at least 30-50% smaller than those of non-canary cells of the main array. Also, MTJs having a diameter larger than those MRAM cells of the main array can be used as multiple time program (MTP) cells. Therefore, MRAM cells within an MRAM array can be used for different purposes depending on the different MTJ diameters.

FIG. 2 illustrates, in block diagram form, an MRAM 100 in accordance with one embodiment of the present invention which includes columns with canary cells. MRAM 100 includes main arrays 101-104 and canary arrays 106-109 (also referred to as canary cells). MRAM 100 also includes wordline drivers (WD) 110, 118, 112, and 120 corresponding to each canary array 106-109, respectively. MRAM 100 also includes WD 114 corresponding to main arrays 101 and 102, and WD 116 corresponding to main arrays 103 and 104. MRAM array also includes sense and control circuit 124 corresponding to each of array 101 and 103, and a sense and control circuit 126 corresponding to each of array 102 and 104. MRAM array also includes sense and control circuit 122 corresponding to canary arrays 106 and 108, and sense and control circuit 128 corresponding to canary arrays 107 and 109. As will be described in more detail below, sense and control circuits of FIG. 2 includes circuits required to read and write to main and canary arrays, such as column multiplexers, sense amplifiers, input/output (I/O) drivers, latches, and any other circuit required for the read and writes. The sense and control circuits also include built-in self-test (BIST) circuitry which accesses the canary arrays to perform testing for the detection of problematic magnetic fields. Note that canary arrays are interspersed in MRAM 100, and in the illustrated embodiment, are placed at the four corners of MRAM 100.

Main arrays 101-104 of MRAM 100 includes MRAM cells which store the MRAM data, and thus may be referred to as the data arrays. The MRAM data is accessed by any master requesting to read or write data to the MRAM array. The memory cells of main arrays 101-104, with the exception of section 130, are also referred to as main memory cells or regular memory cells and each have a regular MRAM cell diameter. The memory cells of canary arrays 106-109 are also referred to as canary cells and each have an MRAM cell diameter that is smaller than the diameter of the regular MRAM cells, such that they are weaker and more susceptible to flipping states in the presence of a magnetic field. In one embodiment, the regular MRAM cells all have a cell diameter that is substantially the same as each other and the canary cells all have a cell diameter that is substantially the same as each other. However, the MTJ diameter of the MRAM cells are all larger than any MTJ diameter of the canary cells. In the illustrated embodiment of FIG. 1, main array 104 includes a section 130 of MRAM memory cells which have a larger MTJ diameter than the MTJ diameter of the regular MRAM cells, which allows these MRAM memory cells to be used as MTP cells. In alternate embodiments, any of arrays 101-104 can include a section of MTP cells.

FIG. 3 illustrates, in block diagram form, an MRAM array 150 in accordance with one embodiment of the present invention which includes rows with canary cells. MRAM array 150 includes main arrays 151-154 and canary arrays 156-159 (also referred to as canary cells). MRAM array 150 also includes wordline drivers (WD) 160 and 166 corresponding to canary arrays 156-157 and canary arrays 158-159, respectively. MRAM array 150 also includes WD 162 corresponding to main arrays 151 and 152, and WD 164 corresponding to main arrays 153 and 154. MRAM array also includes sense and control circuit 172 corresponding to each of array 151 and 153, and a sense and control circuit 174 corresponding to each of array 152 and 154. MRAM array also includes sense and control circuit 168 corresponding to canary array 156, sense and control circuit 170 corresponding to canary arrays 157, sense and control circuit 178 corresponding to canary arrays 158, and sense and control circuit 180 corresponding to canary array 159. Sense and control circuits of FIG. 3 includes circuits required to read and write to main and canary arrays, such as column multiplexers, sense amplifiers, input/output (I/O) drivers, latches, and any other circuit required for the read and writes. The sense and control circuits also include built-in self-test (BIST) circuitry which accesses the canary arrays to perform testing for the detection of problematic magnetic fields. Note that canary arrays are interspersed in MRAM array 150, and in the illustrated embodiment, are placed at the four corners of MRAM array 150. Note that operation of MRAM array 150 is analogous to MRAM memory array 100 but with a slightly different structure in which canary cells are in rows rather than columns of the MRAM array. Alternate embodiments may have different structures than those of FIGS. 2 and 3 and may distribute any number of canary arrays or canary cells in any way throughout the MRAM array.

Figure 4:
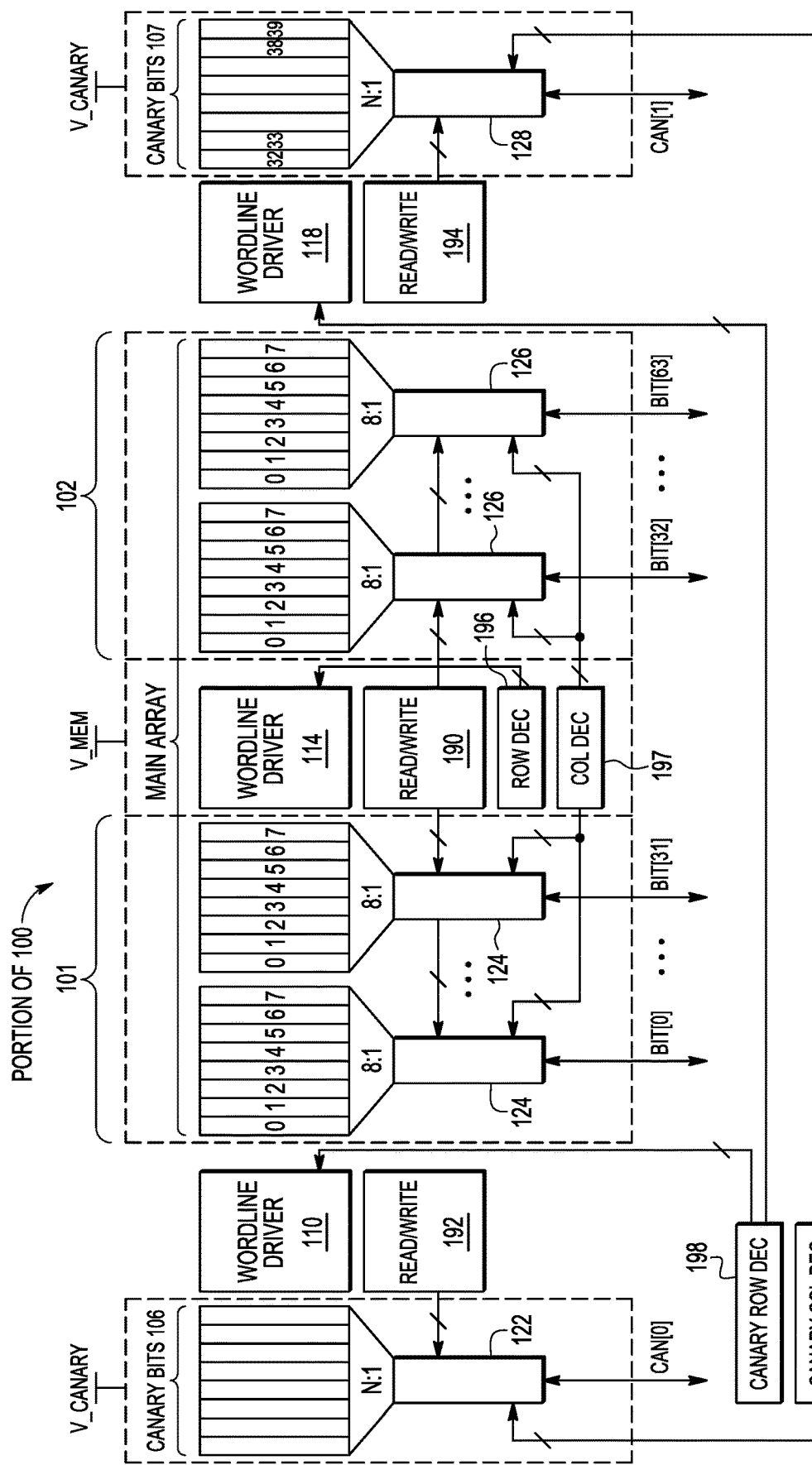
FIG. 4 illustrates, in block diagram form, the MRAM of FIG. 2 in further detail in accordance with one embodiment of the present invention.

FIG. 4 illustrates, in block diagram form, a more detailed version of a portion of MRAM 100, including main arrays 101 and 102, canary arrays 106 and 107, sense and control circuits 122, 124, 126, and 128, WD 110, 114, and 118, read/write (R/W) circuits 190, 192, and 194, a row decode circuit 196, a column decode circuit 197, a canary row decode circuit 198, and a canary column decode circuit 199. WD 114 is coupled to main arrays 101 and 102, WD 110 is coupled to canary array 106, and WD 118 is coupled to canary array 107. R/W circuit 190 is coupled to sense and control circuits 124 and 126, R/W circuit 192 is coupled to sense and control circuit 122, and R/W circuit 194 is coupled to sense and control circuit 128. Row decode circuit 196 is coupled to WD 114, column decode circuit 197 is coupled to sense and control circuits 124 and 126. Canary row decode circuit 198 is coupled to WD 110 and WD 118, and canary column decode circuit 199 is coupled to sense and control circuits 122 and 128. Main arrays 101 and 102 are powered by V_mem and canary arrays 106 and 107 are powered by V_canary.

Referring first to main arrays 101 and 102, array 101 includes 256 columns of MRAM bitcells, which correspond to bits 0 to 31, and array 102 includes 256 columns of MRAM bitcells, which correspond to bits 32 to 63. The columns of array 101 are all coupled to sense and control circuit 124, which includes column multiplexers, sense amplifiers, I/O drivers, and latches, coupled as known in the art. Each group of 8 columns of array 101 is coupled via an 8:1 selector circuit to couple a selected column of the 8 columns to the sense amplifiers or I/O drivers of sense and control circuit 124 to either provide bit[0]-bit[31] for a read operation or receive bit[0]-bit[31] for a write operation. The columns of array 102 are all coupled to sense and control circuit 126, which includes column multiplexers, sense amplifiers, I/O drivers, and latches, coupled as known in the art. Each group of 8 columns of array 102 is coupled via an 8:1 selector circuit to couple a selected column of the 8 columns to the sense amplifiers or I/O drivers of sense and control circuit 126 to either provide bit[32]-bit[63] for a read operation or receive bit[32]-bit[63] for a write operation. Sense and control circuits 124 and 126 are configured for either a read or write operation based on a read/write indicator from read/write circuit 190. For a read operation, bit[0]-bit[63] are read from a selected row in arrays 101 and 102, and for a write operation, bit[0]-bit[63] are written to a selected row in arrays 101 and 102. In alternate embodiments, the main arrays of MRAM 100 can be designed with any number of bits, and is not limited to 64 bits.

Referring to canary arrays 106 and 107, array 106 includes N columns of canary cells, which correspond to canary bit 0 (can[0]), and array 107 includes N columns of canary cells, which correspond to canary bit 1 (can[1]). Therefore, in the illustrated embodiment, each canary array provides one corresponding canary bit. In alternate embodiments, each canary array can be designed to store or provide any number of canary bits, and is not limited to 1 bit per array. Also, N can be any integer number great than or equal to 1. The columns of array 106 are all coupled to sense and control circuit 122, which includes an N:1 column multiplexer, sense amplifier, I/O driver, and latches, coupled as known in the art, similar to sense and control circuits 124 and 126. The columns of array 107 are all coupled to sense and control circuit 128, which includes an N:1 column multiplexer, sense amplifier, I/O driver, and latches, coupled as known in the art, similar to sense and control circuits 124 and 126. Each group of N columns of arrays 106 and 107, respectively, is coupled via an N:1 selector circuit to couple a selected column of the N columns to sense and control circuits 122 and 128, respectively. The N:1 selector circuit for array 106 couples the selected column to the sense amplifiers or I/O drivers of sense and control circuit 122 to provide can[0] for a read operation or receive can[0] for a write operation. The N:1 selector circuit for array 107 couples the selected column to the sense amplifiers or I/O drivers of sense and control circuit 128 to provide can[1] for a read operation or receive can[1] for a write operation. Sense and control circuits 122 and 128 are configured for either a read or write operation based on a read/write indicator from read/write circuit 192 or 194, respectively.

In operation, for an access request to the main array, an access address is received for a read or write request from or to memory arrays 101 and 102, in which a first portion of the access address is provided to column decode 197 and a second, non-overlapping, portion is provided to row decode 196. Column decode 197 decodes the received first portion of the access address and provides the appropriate signals to sense and control circuits 124 and 126 to access the appropriate selected one of the 8 columns for each of the 32 column groupings (only 2 groups shown for each of arrays 101 and 102 in FIG. 4). Control signals received along with the access address are provided to read/write circuit 190 so that read/write circuit 190 determines if the access address corresponds to a read or a write and provides the appropriate indicator to sense and control circuits 124 and 126. Row decode 196 decodes the received second portion of the access address and communicates with WD driver 114, so that WD driver 114 can drive the selected row of arrays 101 and 102. In this manner, for a read request, the appropriate value stored at the selected row and at the selected columns of arrays 101 and 102 is provided as bit[0]-bit[63], or, for a write request, the values of bit[0]-bit[63] are stored into the selected row and columns of arrays 101 and 102.

Operation for canary arrays 106 and 107 are analogous to the operation of arrays 101 and 102. To access canary arrays 106 and 107, a first portion of an access address is provided to canary column decode 199, and a second, non-overlapping, portion of the access address is provided to canary row decode 198. Canary column decode 199 decodes the received first portion of the access address and provides the appropriate signals to sense and control circuits 122 and 128 to access the appropriate selected one of the N columns for each of arrays 106 and 107. Control signals received along with the access address are provided to read/write circuit 192 and 194 so that read/write circuits 192 and 194 determine if the access address corresponds to reads or writes and provides the appropriate indicators to sense and control circuits 122 and 128. Canary row decode 198 decodes the received second portion of the access address and communicates with WD 110 and WD 118, so that WD 110 and WD 118 can drive the selected row of arrays 106 and 107, respectively. In this manner, for a read request, the appropriate value stored at the selected row and at the selected columns of arrays 106 and 107 are provided as can[0] and can[1], or, for a write request, the values of can[0] and can[1] are stored into the selected row and columns of arrays 106 and 107. In one embodiment, the canary bits of MRAM 100 can be accessed with a range of canary access addresses, in which MRAM 100 can include any number of canary arrays to provide any number of canary bits. Therefore, the main array bitcells are accessed with a first range of access addresses and the canary array bitcells are accessed with a second range of access addresses that is non-overlapping with the first range.

Figure 5:
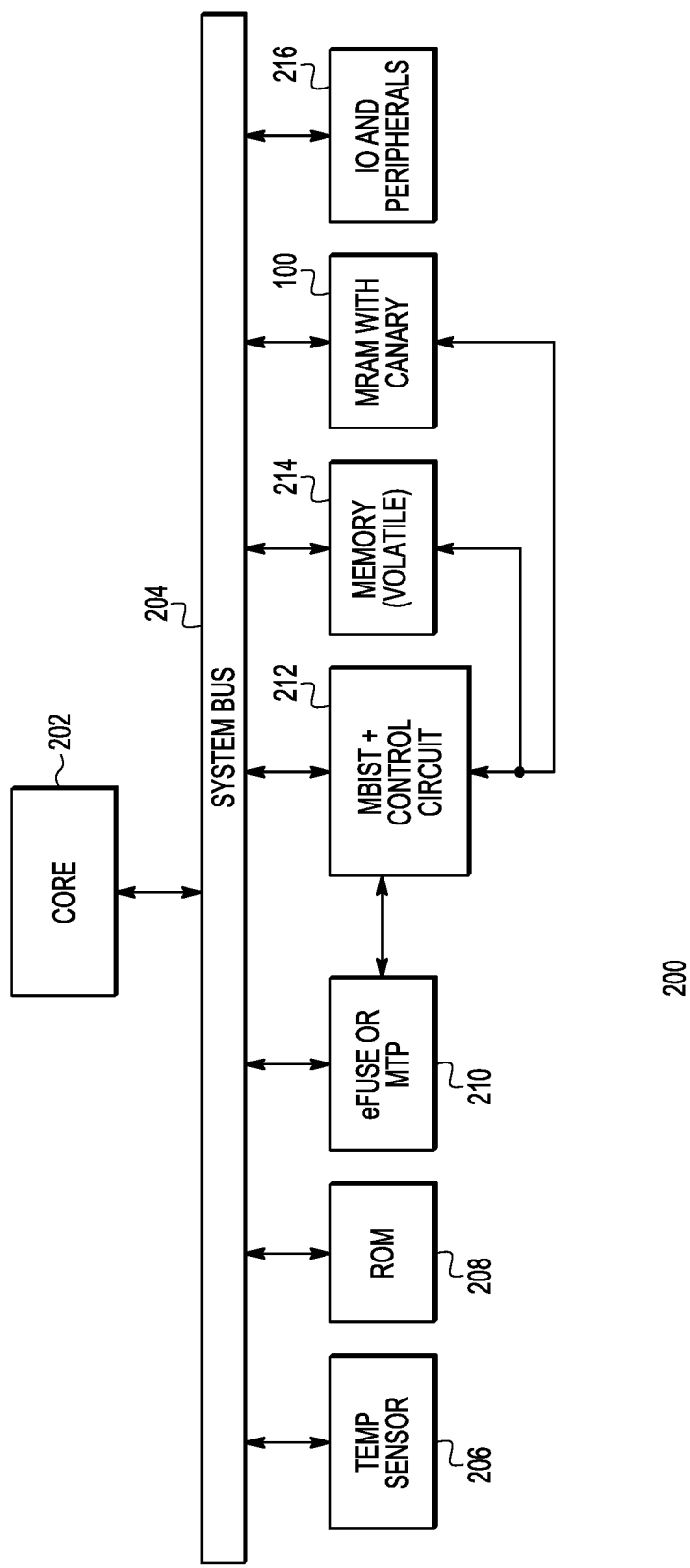
FIG. 5 illustrates, in block diagram from, a System on Chip (SoC) having the MRAM of FIG. 2.

FIG. 5 illustrates a data processing system 200 (also referred to as a system on a chip (SoC)) which includes MRAM 100, in accordance with one embodiment of the present invention. System 200 includes a core 202, a temperature sensor 206, a read-only memory (ROM) 208, an eFuse or multiple program memory (MTP) 210, a memory BIST (MBIST) and control circuit 212, memory 214 (which may be a volatile memory), MRAM 100 (which includes canary bits), and input/output (I/O) and other peripherals 216, each bidirectionally coupled via a system bus 204. In alternate embodiments, system bus 204 may be any type of system interconnect. System 200 may include more or fewer elements, as needed. MBIST and control circuit 212 is bidirectionally coupled to each of eFuse or MTP 210, memory 214, and MRAM 100.

In operation, the canary bits in MRAM 100 can be used by MBIST and control circuit 212 to determine when a magnetic field becomes problematic and threatens the data stored in the main arrays of MRAM 100. For example, as soon as a canary bit is detected as changing states, MBIST and control logic 212 can indicate a warning or initiate recovery operations. Also, temperature sensor 206 may be used in combination with the canary bits to help determine impending problems. Temperature sensor 206 provides an indication of the temperature of system 200, and this indication can be used by MBIST and control circuit 212. In one embodiment, if a canary bit has changed states (no longer equals its intended value), and temperature sensor 206 indicates the temperature of system 200 is below a predetermined threshold, the change in state of the canary bit is most likely due to a magnetic field. However, if the canary bit has changed state and the temperature sensor 206 indicates the temperature of system 200 is too high (e.g. above the predetermined threshold), it is unknown whether the change in state of the canary bit is due to a magnetic field or the high temperature. In this case, and indication of the change in state of a canary bit can still be provided by MBIST and control circuit 212 along with an indication of a high temperature. Depending on the embodiment, this may either prevent the recovery operations from occurring or the recovery operations may be performed even if the cause of the canary bit change is unknown.

Figure 6:
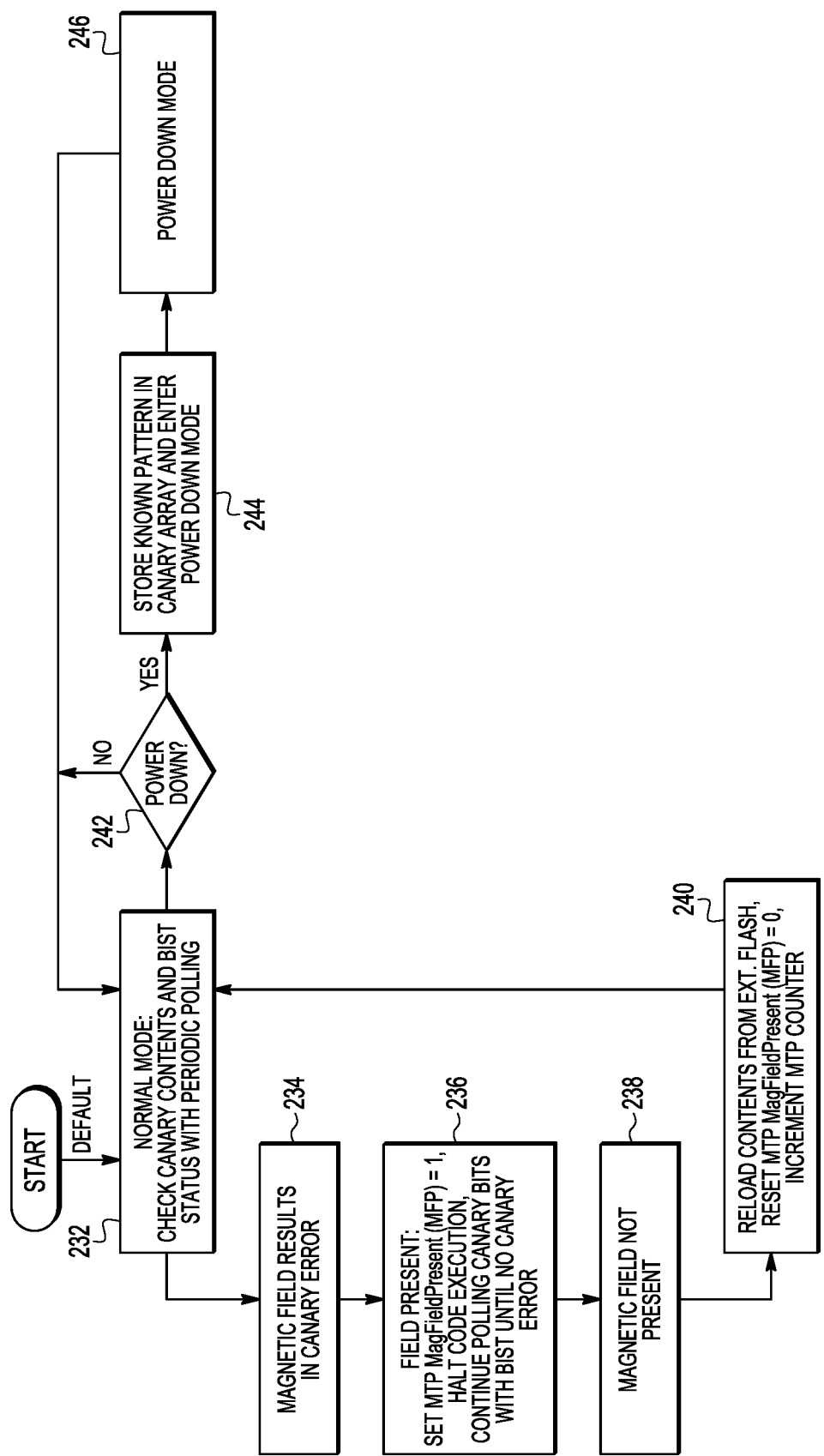
FIGS. 6 and 7 illustrate, in flow diagram forms, methods of operating an MRAM with canary bits, in accordance with embodiments of the present invention.

FIG. 6 illustrates, in flow diagram form, a method 230 of operating MRAM 100, in accordance with an embodiment of the present invention. In the embodiment of FIG. 6, it is assumed that MRAM 100 is within an SoC (such as system 200) and used as non-volatile static random access memory (SRAM). Method 230 begins with block 232 in which system 200 operates in normal mode. During normal mode, the contents of the canary bits of MRAM 100 and the BIST status (provided by, e.g., MBIST and control logic 212), with periodic polling. For example, core 202 or MBIST and control logic 212 itself can periodically poll for this information. The BIST status indicates whether a magnetic field is present or not. Note that MBIST and control circuit 212 may perform more types of testing for MRAM 100 and for other memories, such as memory 214, of system 200, and therefore, may provide any number of different indicators indicative of different problems. For the example of FIGS. 6 and 7, though, the BIST status at least provides information as to the presence of a magnetic field.

In one embodiment, the canary bits of MRAM 100 are all initially written with a known pattern, i.e. predetermined values or states. So long as they maintain that value, it is assumed that the canary bits are not being affected by errant magnetic fields. Periodically, these canary bit are polled (e.g. read) and compared with the predetermined values. Upon any read, if any one of the canary bits does not match the expected predetermined value, it is assumed that the canary bits are being affected by a magnetic field. However, since the canary bitcells are smaller than the regular MRAM array bitcells, the regular MRAM array bitcells may or may not yet affected by the magnetic field. Therefore, upon any periodic poll in which the canary bits are read, an indication that a canary bit does not match provides an indication of impending data loss of the main MRAM arrays or an actual corruption of some of the data in the MRAM array.

Referring to FIG. 6, when a polling of the canary bits indicates a canary error (in which one or more canary bits does not match the expected state), a magnetic field is indicated at block 234. Upon a magnetic field being present, in block 236, a magnetic field present flag, MagFieldPresent (MFP), is set to a logic level 1. This MFP flag can be stored in any MTP storage element, such as any MTP MRAM cell in section 130 of array 104 (illustrated in FIG. 2). With the magnetic field present, code execution from MRAM 100 is halted while polling of the canary bits continue. The polling is continued until the BIST indicates there is no longer a canary error. That is, once the magnetic field disappears, the canary bits, when read, will again match their predetermined value, and indicate no canary error. At this point, at block 238 a magnetic field is no longer present. With the magnetic field no longer present, in block 240, recovery operations are performed. For example, the contents of MRAM 100 are reloaded from an external flash since the contents of MRAM 100 may have been corrupted. The MFP flag is reset or cleared to a logic level 0, and an MTP counter is incremented. This counter, similar to the MFP flag, can also be implemented in an MTP storage element, such as in any MTP MRAM cell in section 130 of array 104. This counter is used to log the number of incidents of magnetic/thermal excursions that have occurred. Method 230 then returns to block 232 in which system 200 operates in normal mode.

During normal mode, system 200 may go into power down mode. At decision diamond 242 it is determined whether system 200 is going into power down mode. If not, method returns to block 232. If system 200 is going into power down mode, then, at block 244, the known pattern (the predetermined values) is stored into the canary bits of MRAM 100 before power down mode is entered at block 244. In block 246, system 200 is in power down mode until normal mode is resumed at block 232.

Figure 7:
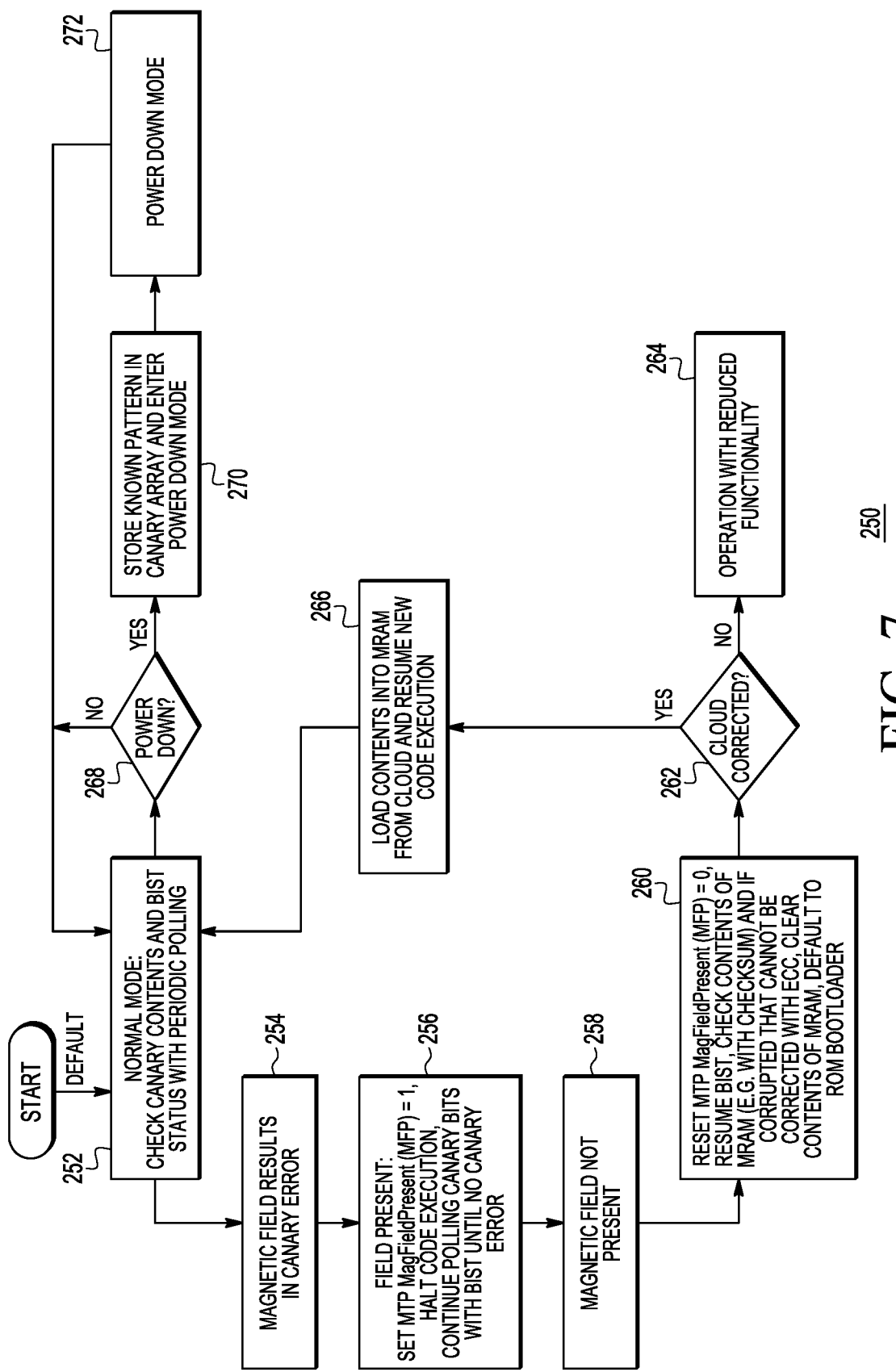

FIG. 7 illustrates, in flow diagram form, a method 250 of operating MRAM 100, in accordance with an embodiment of the present invention. In the embodiment of FIG. 7, it is assumed that MRAM 100 is within an SoC (such as system 200) and used as Flash memory. Method 250 begins with block 252 in which system 200 operates in normal mode. During normal mode, the contents of the canary bits of MRAM 100 and the BIST status (provided by, e.g., MBIST and control logic 212), with periodic polling, as was described above in reference to FIG. 6. When a polling of the canary bits indicates a canary error (in which one or more canary bits does not match the expected state), a magnetic field is indicated at block 254. Upon a magnetic field being present, in block 256, a magnetic field present flag, MagFieldPresent (MFP), is set to a logic level 1. With the magnetic field present, code execution from MRAM 100 is halted while polling of the canary bits continue. The polling is continued until the BIST indicates there is no longer a canary error. At this point, at block 258 a magnetic field is no longer present. Note that the descriptions provided above with respect to blocks 232, 234, 236, and 238 apply to blocks 252, 254, 256, and 258, respectively.

With the magnetic field no longer present, in block 260, recovery operations are performed. The MFP flag is reset or cleared to a logic level 0. BIST resumes checking MRAM 100, in which the contents of MRAM are checked by MBIST and control logic 212. For example, this may be done with a checksum, as known in the art. If the MRAM data is corrupted and cannot be corrected with error correction code (ECC), the contents of MRAM 100 are cleared. Upon doing so, system 200 is defaulted to a ROM bootloader (stored, e.g., in ROM 208) since the contents of MRAM 100 are cleared. Method 230 proceeds to decision diamond 262 where it is determined if system 200 is connected to a cloud. If so, at block 266, the contents of MRAM 100 are reloaded from the cloud and new code execution from MRAM 100 may be resumed, now with the correct contents of MRAM 100. Method 230 then returns to block 252 in which system 200 operates in normal mode. If not connected to a cloud, then, at block 264, operation of system 200 proceeds but with reduced functionality due to the lack of data in MRAM 100.

During normal mode, system 200 may go into power down mode. At decision diamond 268 it is determined whether system 200 is going into power down mode. If not, method returns to block 252. If system 200 is going into power down mode, then, at block 270, a known pattern (the predetermined values) is stored into the canary bits of MRAM 100 before power down mode is entered at block 270. In block 272, system 200 is in power down mode until normal mode is resumed at block 252.

Note that in the examples of FIGS. 6 and 7, temperature sensor 206 was not used. However, in alternate embodiments, a canary error can further be qualified by the temperature provided by temperature sensor 206 to help the BIST possible differentiate between magnetic field threats to MRAM 100 from high temperature threats to MRAM 100. Also, while the canary arrays and the main arrays of MRAM 100 can be powered by different supplies, MBIST and control circuit 212 are powered by the same supply as the main arrays so that diagnostic can be run continuously.

Therefore, by now it can be understood how canary cells integrated within an MRAM memory can be used to detect magnetic attacks of the MRAM memory. These canary cells have smaller dimensions that the regular cells of the MRAM memory such that they are more susceptible to a magnetic attack. By storing known values into the canary bits and periodically polling those bits to determine if they change states, a magnetic field threat can be detected and recovery operations performed to ensure the integrity of the data in the main arrays of the MRAM. In one embodiment, upon detection of a magnetic field thread, polling of the canary bits is continued until it is determined that the magnetic threat is no long present, and, at this point, the MRAM data can be reloaded with uncorrupted data. The absence of the magnetic threat ensures that the MRAM can now safely store the uncorrupted data. Also, a temperature sensor can further be used with the canary bits to help differentiate between magnetic threats or data corruption due to high temperatures.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Some of the above embodiments, as applicable, may be implemented using a variety of different information processing systems. For example, although FIGS. 2-5 and the discussion thereof describe exemplary architectures, these exemplary architectures are presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Also for example, in one embodiment, the illustrated elements of system 200 are circuitry located on a single integrated circuit or within a same device. Alternatively, system 200, if not an SoC, may include any number of separate integrated circuits or separate devices interconnected with each other.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, the canary bits can be integrated in different patterns into MRAM 100 rather than those illustrated in FIGS. 2 and 3. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, a Magnetic Random Access Memory (MRAM) system has an MRAM array with a plurality of main MRAM bitcells and a plurality of canary MRAM bitcells in which a first Magnetic Tunnel Junction (MTJ) diameter of each of the main MRAM bitcells is larger than any second MTJ diameter of any of the canary bitcells. In the MRAM system, a method includes reading canary values stored at the canary bitcells and determining if the canary values match expected canary values; when the canary values do not match the expected canary values, indicating a presence of a magnetic field; and in response to determining the presence of the magnetic field: repeating reading the canary values stored at the canary bitcells and comparing the canary values to the expected canary values until the canary values match the expected canary values, indicating the magnetic field is no longer present. In one aspect of the one embodiment, the method further includes, in response to determining the presence of a magnetic field, halting code execution from the MRAM array, wherein code is stored in the plurality of main MRAM bitcells. In a further aspect, the method further includes in response to indicating the magnetic field is no longer present, reloading code into the plurality of main MRAM bitcells of the MRAM array. In another aspect, the method further includes prior to the reading the canary values stored at the canary bitcells, storing a known pattern into the plurality of canary bitcells. In another further aspect, the method further includes, in response to indicating that magnetic field is no longer present: determining whether contents of the MRAM array have been corrupted; when the contents are determined to be corrupted and uncorrectable, clearing the contents of the MRAM. In yet a further aspect, the method further includes, in response to indicating that magnetic field is no longer present: after clearing the contents of the MRAM, reloading code into the plurality of main MRAM bitcells of the MRAM array. In another aspect, the method further includes prior to entering a power down mode, storing a known pattern into the plurality of canary bitcells; and entering the power down mode. In another aspect, the plurality of main MRAM bitcells are accessed with a first range of access addresses and the plurality of canary MRAM bitcells are accessed with a second range of access address, wherein the first range and second range are non-overlapping. In another aspect, the canary MRAM bitcells are more susceptible to corruption in response to the magnetic field as compared to the main MRAM bitcells. In yet another aspect, the MRAM array includes a plurality of multiple time programmable (MTP) MRAM bitcells, in which a third MTJ diameter of each of the MTP MRAM bitcells is larger than any first MTJ diameter of any of the main MRAM bitcells. In a further aspect, the method further includes, in response to determining the presence of the magnetic field, setting a flag to a predetermined value, wherein the flag is stored in one of the MTP MRAM bitcells.

In another embodiment, a system on a chip (SoC) includes a Magnetic Random Access Memory (MRAM) array having a plurality of main MRAM bitcells and a plurality of canary MRAM bitcells in which a first Magnetic Tunnel Junction (MTJ) diameter of each of the main MRAM bitcells is larger than any second MTJ diameter of any of the canary bitcells; and test circuitry configured to periodically poll the canary bitcells to determine if values stored at the canary bitcells match expected canary values, wherein when the values do not match the expected canary values, the test circuitry is configured to indicate a presence of a magnetic field, and in response to determining the presence of the magnetic field, continue to poll the canary bitcells until the values match the expected canary values which indicates the magnetic field is no longer present. In one aspect, the test circuitry is further configured to, upon indicating the presence of the magnetic field, setting a flag to a first predetermined value. In a further aspect, the test circuitry is further configured to, when the magnetic field is no longer present, clearing the flag to a second predetermined value. In yet a further aspect, the MRAM array includes a plurality of multiple time programmable (MTP) MRAM bitcells, in which a third MTJ diameter of each of the MTP MRAM bitcells is larger than any first MTJ diameter of any of the main MRAM bitcells, and wherein the flag is stored in one of the MTP MRAM bitcells. In another aspect of the another embodiment, the test circuitry is configured to halt code execution from the MRAM array in response to determining the presence of the magnetic field, wherein the code is stored in the plurality of main MRAM bitcells. In a further aspect, the test circuitry is configured to reload code into the plurality of main MRAM bitcells of the MRAM array in response to indicating the magnetic field is no longer present. In yet another aspect, the second MTJ diameter of each of the canary MRAM bitcells is at least 30% smaller than any first MTJ diameter of any of the main MRAM bitcells.

In yet another embodiment, a Magnetic Random Access Memory (MRAM) includes a plurality of main MRAM bitcells each having a first Magnetic Tunnel Junction (MTJ) diameter; and a plurality of canary MRAM bitcells each having a second MTJ diameter, wherein each first MTJ diameter of the main memory bitcells is larger than any second MTJ diameter of any of the canary bitcells, and wherein the canary MRAM bitcells are more susceptible to corruption in response to a magnetic field as compared to the main MRAM bitcells, and wherein the plurality of main MRAM bitcells are accessed with a first range of access addresses and the plurality of canary MRAM bitcells are accessed with a second range of access address, wherein the first range and second range are non-overlapping. In one aspect, the MRAM further includes a plurality of multiple time programmable (MTP) MRAM bitcells, in which a third MTJ diameter of each of the MTP MRAM bitcells is larger than any first MTJ diameter of any of the main MRAM bitcells.

What is claimed is:

1. In a Magnetic Random Access Memory (MRAM) system having an MRAM array with a plurality of main MRAM bitcells and a plurality of canary MRAM bitcells in which a first Magnetic Tunnel Junction (MTJ) diameter of each of the main MRAM bitcells is larger than any second MTJ diameter of any of the canary bitcells, a method comprising:
   reading canary values stored at the canary bitcells and determining if the canary values match expected canary values;
   when the canary values do not match the expected canary values, indicating a presence of a magnetic field; and
   in response to determining the presence of the magnetic field:
      repeating reading the canary values stored at the canary bitcells and comparing the canary values to the expected canary values until the canary values match the expected canary values, indicating the magnetic field is no longer present.

2. The method of claim 1, further comprising, in response to determining the presence of a magnetic field, halting code execution from the MRAM array, wherein code is stored in the plurality of main MRAM bitcells.

3. The method of claim 2, further comprising:
   in response to indicating the magnetic field is no longer present, reloading code into the plurality of main MRAM bitcells of the MRAM array.

4. The method of claim 1, further comprising:
   prior to the reading the canary values stored at the canary bitcells, storing a known pattern into the plurality of canary bitcells.

5. The method of claim 2, further comprising, in response to indicating that magnetic field is no longer present:
   determining whether contents of the MRAM array have been corrupted;
   when the contents are determined to be corrupted and uncorrectable, clearing the contents of the MRAM.

6. The method of claim 5, further comprising, in response to indicating that magnetic field is no longer present:
   after clearing the contents of the MRAM, reloading code into the plurality of main MRAM bitcells of the MRAM array.

7. The method of claim 1, further comprising:
   prior to entering a power down mode, storing a known pattern into the plurality of canary bitcells; and
   entering the power down mode.

8. The method of claim 1, wherein the plurality of main MRAM bitcells are accessed with a first range of access addresses and the plurality of canary MRAM bitcells are accessed with a second range of access address, wherein the first range and second range are non-overlapping.

9. The method of claim 1, wherein the canary MRAM bitcells are more susceptible to corruption in response to the magnetic field as compared to the main MRAM bitcells.

10. The method of claim 1, wherein the MRAM array includes a plurality of multiple time programmable (MTP) MRAM bitcells, in which a third MTJ diameter of each of the MTP MRAM bitcells is larger than any first MTJ diameter of any of the main MRAM bitcells.

11. The method of claim 10, further comprising:
   in response to determining the presence of the magnetic field, setting a flag to a predetermined value, wherein the flag is stored in one of the MTP MRAM bitcells.

12. A system on a chip (SoC), comprising:
   a Magnetic Random Access Memory (MRAM) array having a plurality of main MRAM bitcells and a plurality of canary MRAM bitcells in which a first Magnetic Tunnel Junction (MTJ) diameter of each of the main MRAM bitcells is larger than any second MTJ diameter of any of the canary bitcells; and test circuitry configured to periodically poll the canary bitcells to determine if values stored at the canary bitcells match expected canary values, wherein when the values do not match the expected canary values, the test circuitry is configured to indicate a presence of a magnetic field, and in response to determining the presence of the magnetic field, continue to poll the canary bitcells until the values match the expected canary values which indicates the magnetic field is no longer present.

13. The system of claim 12, wherein the test circuitry is further configured to, upon indicating the presence of the magnetic field, setting a flag to a first predetermined value.

14. The system of claim 13, wherein the test circuitry is further configured to, when the magnetic field is no longer present, clearing the flag to a second predetermined value.

15. The system of claim 14, wherein the MRAM array includes a plurality of multiple time programmable (MTP) MRAM bitcells, in which a third MTJ diameter of each of the MTP MRAM bitcells is larger than any first MTJ diameter of any of the main MRAM bitcells, and wherein the flag is stored in one of the MTP MRAM bitcells.

16. The system of claim 12, wherein the test circuitry is configured to halt code execution from the MRAM array in response to determining the presence of the magnetic field, wherein the code is stored in the plurality of main MRAM bitcells.

17. The system of claim 16, wherein the test circuitry is configured to reload code into the plurality of main MRAM bitcells of the MRAM array in response to indicating the magnetic field is no longer present.

18. The system of claim 12, wherein the second MTJ diameter of each of the canary MRAM bitcells is at least 30% smaller than any first MTJ diameter of any of the main MRAM bitcells.

19. A Magnetic Random Access Memory (MRAM) comprising:
 a plurality of main MRAM bitcells each having a first Magnetic Tunnel Junction (MTJ) diameter; and
 a plurality of canary MRAM bitcells each having a second MTJ diameter, wherein each first MTJ diameter of the main memory bitcells is larger than any second MTJ diameter of any of the canary bitcells, and wherein the canary MRAM bitcells are more susceptible to corruption in response to a magnetic field as compared to the main MRAM bitcells, and wherein the plurality of main MRAM bitcells are accessed with a first range of access addresses and the plurality of canary MRAM bitcells are accessed with a second range of access address, wherein the first range and second range are non-overlapping.

20. The MRAM of claim 19, further comprising a plurality of multiple time programmable (MTP) MRAM bitcells, in which a third MTJ diameter of each of the MTP MRAM bitcells is larger than any first MTJ diameter of any of the main MRAM bitcells.

* * * * *